(12) United States Patent
Stolt et al.

(10) Patent No.: US 8,569,094 B2
(45) Date of Patent: Oct. 29, 2013

(54) SELECTIVE REMOVAL AND CONTACTING OF THIN FILM SOLAR CELLS

(75) Inventors: Lars Stolt, Uppsala (SE); Olle Lundberg, Uppsala (SE); Peter Neretnieks, Taby (SE); Johannes Segner, Kassel (DE)

(73) Assignee: Solibro Research AB, Uppsala (SE)

( * ) Notice: Subject to any disclaimer, the term of this patent is extended or adjusted under 35 U.S.C. 154(b) by 355 days.

(21) Appl. No.: 12/997,041

(22) PCT Filed: Jun. 12, 2009

(86) PCT No.: PCT/SE2009/050725
§ 371 (c)(1),
(2), (4) Date: Dec. 9, 2010

(87) PCT Pub. No.: WO2009/151396
PCT Pub. Date: Dec. 17, 2009

(65) Prior Publication Data
US 2011/0088750 A1    Apr. 21, 2011

(30) Foreign Application Priority Data
Jun. 13, 2008  (SE) ...................................... 0801395

(51) Int. Cl.
*H01L 31/0224*  (2006.01)
*H01L 31/18*    (2006.01)

(52) U.S. Cl.
USPC ................. 438/64; 257/E31.11; 257/E31.124

(58) Field of Classification Search
None
See application file for complete search history.

(56) References Cited

U.S. PATENT DOCUMENTS

| | | | |
|---|---|---|---|
| 4,631,351 A | 12/1986 | Tawada et al. | |
| 4,745,078 A | 5/1988 | Stetter et al. | |
| 6,441,301 B1 | 8/2002 | Satoh et al. | |
| 7,122,398 B1 | 10/2006 | Pichler | |
| 8,288,681 B2 | 10/2012 | Murase et al. | |
| 2008/0115821 A1 | 5/2008 | Xu et al. | |
| 2009/0320895 A1 | 12/2009 | Yagiura et al. | |
| 2010/0248413 A1* | 9/2010 | Strand et al. | 438/67 |

FOREIGN PATENT DOCUMENTS

| | | |
|---|---|---|
| CN | 1927521 A | 3/2007 |
| JP | 2008060374 A | 3/2008 |

OTHER PUBLICATIONS

International Search Report, dated Sep. 3, 2009, from corresponding PCT application.

* cited by examiner

*Primary Examiner* — Seahvosh Nikmanesh
(74) *Attorney, Agent, or Firm* — Young & Thompson (57) ABSTRACT

A method for manufacturing a thin film solar cell device including a CIGS based thin film solar cell module (17). Edge deletion by selective removal of a multilayer structure (13) that includes at least a front contact (15) and a CIGS layer (7) to expose the back contact (5) in at least a peripheral area (22) in the circumferential region (21) of the module (17) adjacent to a first longitudinal thin film solar cell segment (18) allows for contacting of the module (17) by attaching at least a first contacting element (27) to the back contact (5). Preferably a blasting operation using simultaneous supply of blasting agents and gathering of debris in a blasting chamber (32) arranged on the thin film solar cell module (17) is used for the selective removal.

13 Claims, 7 Drawing Sheets

SELECTIVE REMOVAL AND CONTACTING OF THIN FILM SOLAR CELLS

TECHNICAL FIELD OF THE INVENTION

The present invention relates to the manufacturing of thin film solar cells and in particular edge deletion and electrical contacting of such solar cells.

BACKGROUND OF THE INVENTION

Solar cells provide a means to produce electric power with minimal environmental impact. In order to become a commercial success solar cells need to be efficient, to have low cost, to be durable, and to avoid causing other environmental problems.

Today's dominant solar cell technology is based on crystalline silicon. It fulfils many of the requirements mentioned above but crystalline silicon solar cells can not readily be produced at such a low cost that large scale power generation is cost effective. They also require relatively large amounts of energy to manufacture them, which is an environmental disadvantage.

Solar cells based on thin film technologies have been developed. They offer the potential for substantial cost reductions but have, in general, lower conversion efficiencies and less durability than crystalline silicon solar cells. A very promising thin film solar cell technology is based on a semiconductor CIGS layer, which has demonstrated high efficiency (16.6% in small prototype modules) and durability in operation. However, this technology has yet to demonstrate that it can produce cells commercially at a low cost. CIGS is an abbreviation for the typical alloying elements in the semiconductor material, i.e. Cu, In, Ga, Se and S, forming a $Cu(In_{1-x}Ga_x)Se_2$ compound. Commonly a CIGS layer also comprises sulphur, i.e. $Cu(In_{1-x}Ga_x)(Se_{1-y}S_y)_2$.

A typical CIGS solar cell comprises a CIGS layer on a substrate material such as sheet glass or metal foil, which has been coated with a layer of molybdenum. This layer serves as the back contact of the solar cell. The CIGS growth is followed by the formation of a pn-junction by deposition of a buffer layer, typically 50 nm of CdS, optionally a high resistivity thin layer of ZnO and a front contact made of a transparent conductive oxide, e.g. of Al-doped ZnO (ZAO). The buffer layer of CdS may be exchanged for e.g. a $ZnO_zY_{1-z}$ layer.

CIGS-based thin film solar cells are commonly fabricated by high vacuum co-evaporation of the elements Cu, In, Ga and Se. By way of example, a prior art method for manufacturing a thin film solar cell module that comprises a plurality of serially-connected longitudinal solar cells comprises the steps of:

providing a substrate with a Mo-coating that is divided into longitudinal segments;

depositing the CIGS layer on the Mo-coated substrate using an in-line production apparatus and subsequently depositing the buffer layer and the high resistivity layer onto the CIGS layer;

forming grooves in the semiconductor layers, commonly by using a mechanical stylus, to form longitudinal segments parallel with, and overlapping, the longitudinal segments in the Mo-coating;

depositing a front contact on the top surface of the segmented semiconductor layers; and providing an array of serially-connected longitudinal segments by patterning, i.e. forming grooves in, the front contact and the underlying semiconductor layers using a mechanical stylus.

The next step is to make a useful thin film solar cell device out of this thin film solar cell module. To be able to reliably perform electrical insulation and hermetic sealing of the solar cell module, all thin film layers on top of the glass substrate of the thin film solar cell module in a circumferential region are usually completely removed in a so-called "edge deletion" operation. Laser ablation, sand blasting and grinding are currently used edge deletion methods. The edge deletion makes it possible to obtain a hermetic seal against the glass in the peripheral region which prevents corrosion of the thin film layers of the solar cell module. Electrical insulation is also necessary to prevent current leakage and short circuit.

Furthermore the edge deletion operation is usually followed by contacting, so-called "edge tabbing", of the conducting uppermost layer (front contact) of the solar cells using e.g. conductive glue and copper strips, lamination, framing and mounting of a junction box to which cables can be connected. The so-called "tab wires" can be lead to the junction box e.g. through holes drilled in the substrate or via the edges of the substrate.

The challenging edge deletion and edge tabbing operations are important issues for making reliable thin film solar cell devices. The current development of thin film solar cell devices requires efficient processes with high throughput to obtain low cost, high performance solar cell devices. Mean for lowering the cost includes an increase of the surface area of the solar cell modules. Accordingly, high removal rates in the edge deletion operation are required, with maintained, or preferably improved, accuracy and cleanliness. The durability and the performance of the final solar cell devices may be seriously reduced if residuals from the edge deletion step are left on the solar cell modules until contacting and lamination. Consequently cleaning operations, increasing the processing time and limiting the throughput, are usually required. In addition the dust from the machining operation may be hazardous and needs to be collected and disposed of safely.

SUMMARY OF THE INVENTION

The prior art has drawbacks with regard to being able to provide a method for manufacturing thin film solar cell devices, especially with respect to providing methods and devices for edge deletion and contacting of thin film solar cells that are suitable for efficient and reliable processing of thin film solar cell devices.

The object of the present invention is to overcome the drawbacks of the prior art. This is achieved by methods and devices as defined in the independent claims.

A method according to the present invention relates to manufacturing a thin film solar cell device comprising a back contact and a multilayer structure that form a thin film solar cell module, wherein the multilayer structure comprises at least a CIGS-layer and a front contact. The method comprises the steps of: depositing the back contact and the multilayer structure on a substrate; edge deletion by selectively removing the multilayer structure in at least a first peripheral area in a circumferential region of the thin film solar cell module, thereby exposing the back contact in at least a first longitudinal portion of the first peripheral area; and connecting a first contacting means to the exposed back contact.

Preferably the selective removal comprises blasting using an abrasive medium. The blasting is preferably made maskless, that is without the use of a mask, by using a blasting chamber arranged on the multilayer structure wherein blasting agents are supplied and debris is gathered simultaneously.

The thin film solar cell module may comprise a plurality of serially-connected thin film solar cell segments. Preferably the back contact is exposed in a first longitudinal portion of the circumferential region adjacent the first thin film solar cell segment and in a second longitudinal portion of the circumferential region adjacent the last thin film solar cell segment of the serially-connected segments. The thin film solar cell module is preferably contacted at both ends by connecting a first and a second contacting means to the exposed back contact adjacent the first and the last thin film solar cell segments, respectively.

The connecting of the contacting means to the exposed back contact can for example be performed using ultrasonic welding, thermocompression bonding, electric spot welding, a conductive adhesive or glue, or the like.

A thin film solar cell device according to one embodiment of the invention comprises a thin film solar cell module having at least a first longitudinal thin film solar cell segment. Said longitudinal thin film solar cell segment comprises at least a back contact and a multilayer structure on a substrate, wherein the multilayer structure comprises at least a CIGS layer and a front contact. A first contacting means is, preferably directly, connected to the back contact opposite of the substrate in a first longitudinal portion of a first peripheral area adjacent to the first thin film solar cell segment.

The thin film solar cell device preferably comprises a plurality of serially-connected longitudinal thin film solar cell segments beginning with the first thin film solar cell segment and ending with a last thin film solar cell segment. A second contacting means is directly connected to the back contact opposite of the substrate in a second longitudinal portion of a second peripheral area adjacent to the last thin film solar cell segment. The thin film solar cell device may be sealed against the exposed substrate in a circumferential region of the thin film solar cell module.

One advantage of contacting the solar cell on the back contact is that this allows more reliable and/or more cost effective, contacting arrangements.

Thanks to the invention it is possible to provide a reliable and cost effective thin film solar cell device owing to the blasting operation of the present invention leaving a surface that is relatively clean.

It is a further advantage of the invention to provide a thin film solar cell device that is better sealed than prior art solar cell devices. This is achieved by the back contact contacting and the effective removal of the layers of the thin film solar cell. The machined surface of a thin film solar cell module of the present invention provides better adhesion to the sealing material than a washed or untreated substrate surface.

BRIEF DESCRIPTION OF THE DRAWINGS

Preferred embodiments of the invention will now be described with reference to the accompanying drawings, wherein

FIGS. 3a-e is a schematic illustration of one embodiment of a method for edge deletion and contacting of a thin film solar cell module according to the present invention.

DETAILED DESCRIPTION OF EMBODIMENTS

Figure 1A:
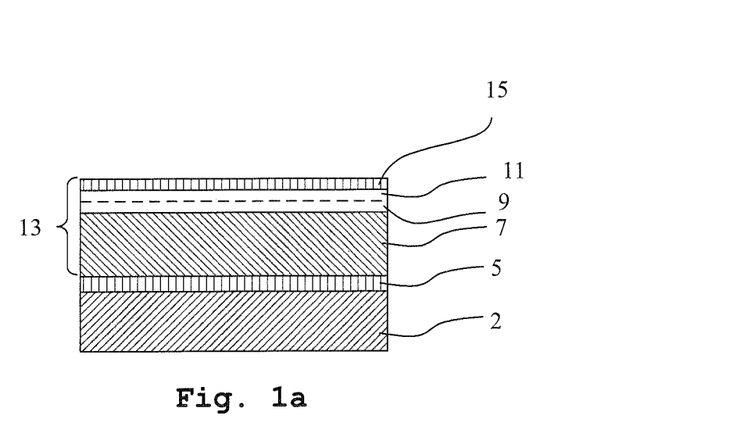
FIG. 1a is a schematic cross sectional view of a thin film solar cell.
Figure 1B:
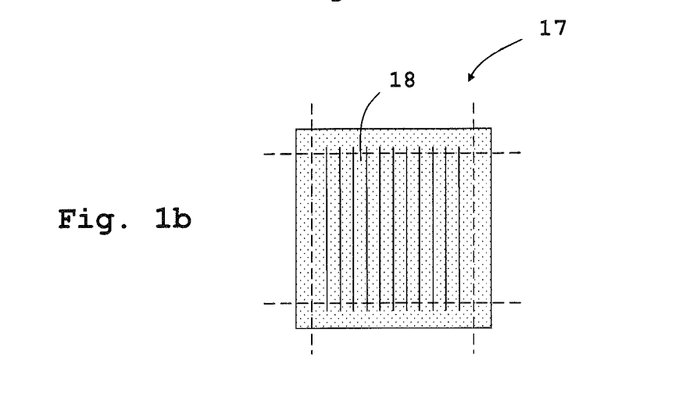
FIG. 1b is a schematic top view of a thin film solar cell module comprising a plurality of serially-connected thin film solar cells.

Referring to FIGS. 1a-b, 1, a thin film solar cell device according to the present invention comprises a layered structure forming a thin film solar cell on a substrate 2. The layered structure by way of example comprises a back contact layer 5 on a substrate 2, a CIGS layer 7, an optional buffer layer 9, an optional high resistivity layer 11 and a front contact layer 15. In the manufacturing of such a thin film solar cell, the substrate 2 made of e.g. sheet glass or metal foil, is coated with a layer of e.g. molybdenum. This layer serves as a back contact 5 of the thin film solar cell. The growth of a CIGS-layer 7 is optionally followed by the formation of a pn-junction by deposition of the buffer layer 9, e.g. formed of CdS or $ZnO_zSi_{1-z}$, optionally the high resistivity thin layer 11, e.g. formed of ZnO, and a front contact 16 of a transparent conductive oxide, e.g. formed of ZAO (Al-doped ZnO). Preferably, a plurality of thin film solar cell segments 18 is serially-connected to form a thin film solar cell module 17. FIG. 1b schematically illustrates a thin film solar cell module 17 comprising a plurality of serially-connected longitudinal thin film solar cell segments 18 before an edge deletion operation. Then the layered structure covers essentially the whole substrate 2.

In an edge deletion operation according to prior art the layered structure on the substrate is completely removed in the circumferential area adjacent to the edges of the thin film solar cell module, i.e. outside the broken lines of the thin film solar cell module as illustrated in FIG. 1b. After the edge deletion operation the thin film solar cell module is contacted on top of the first and the last longitudinal thin film solar cell segment in order to be part of a circuit that forms a thin film solar cell device that generates power. The present invention provides an improved method for accomplishing the edge deletion operation and the contacting of the thin film solar cell module.

Thin film solar cells of CIGS-type may be constructed in such way that the contact adjacent to the substrate should be called the "front contact" instead of the "back contact" (as described above), since the thin film solar cell device is built so that in use the light is incident through the substrate instead of through the layers on the opposite side of the structure. The present invention is described in relation to a thin film solar cell device wherein the light is incident from the CIGS-side, i.e. with the back contact 5 between the substrate 2 and the CIGS layer 7, however the present invention is not limited to this design.

The figures are not to scale and for the sake of clarity of the figures the relative dimensions are not always accurate, e.g. some layers are shown as being too thin relative to others.

In addition, the materials of the layered structure of the thin film solar cell device, i.e. the back contact layer 5, the optional buffer layer 9, and the optional high resistivity layer 11 may, as a person skilled in the art appreciates, be replaced by other materials or combination of materials. Further, additional layers may be added to the layered structure.

Figure 2:
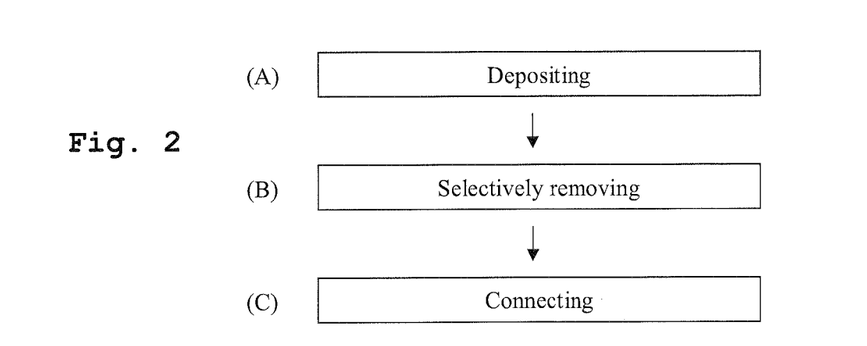
FIG. 2 is a flow diagram of one embodiment of a method according to the present invention.

Referring to FIG. 2, the present invention provides a method of manufacturing a thin film solar cell device. The thin film solar cell device comprises a back contact 5 and a multilayer structure 13 that forms a thin film solar cell module 17, wherein the multilayer structure 13 comprises at least a CIGS-layer 7 and a front contact 15. The thin film solar cell module comprises at least a first thin film solar cell segment 18. The method comprises the steps of:
  depositing the back contact 5 and the multilayer structure 13 on a substrate 2;
  edge deletion by selectively removing the multilayer structure 13 in at least a first peripheral area 22 in a circumferential region 21 of the thin film solar cell module 17 to expose the back contact 5 in at least a first longitudinal portion 3 of the first peripheral area 22; and
  connecting a first contacting means 27 to the exposed back contact 5 in the first longitudinal portion 3 of the first peripheral area 22.

Preferably the thin film solar cell module 17 of the present invention comprises a plurality of serially-connected longitudinal thin film solar cell segments 18 beginning with the first thin film solar cell segment 18 and ending with a last thin film solar cell segment 20.

In one embodiment of the present invention the step of selectively removing comprises blasting. The blasting is adapted to selectively remove the multilayer structure 13 and to expose the back contact 5. This selective removal by blasting is enabled by the different properties of the different layers of the thin film solar cell module 17. For example, the back contact 5 may be made of molybdenum, which is more ductile than the relatively brittle multilayer structure 13, which comprises semiconducting materials. In other words, the erosion resistance of the back contact 5 is higher than the erosion resistance of the multilayer structure 13.

The blasting can be done by providing the blasting agent 36 to the blasting chamber 36 in a sequence of predetermined doses, or in a continuous way, by using a blasting agent dosing device.

In one embodiment of the present invention the multilayer structure 13 is selectively removed using a mechanical stylus. Due to its different mechanical properties of the layers in the layered structure, i.e. the abrasion resistance, the back contact is at least partly left on the substrate 2.

In one embodiment of the present invention the multilayer structure 13 is selectively removed using laser machining, i.e. the multilayer structure 13 is removed by laser ablation. The back contact is at least partly left by controlling the settings of the laser.

In one embodiment of the method of the present invention the step of edge deletion by selective removing the multilayer structure 13 further comprises the step of exposing the back contact in a second longitudinal portion 4 of a second peripheral area 22, the first and the second longitudinal portions 3, 4 being on opposite sides of the thin film solar cell module 17. Furthermore, the step of connecting comprises connecting a second contacting means 29, preferably directly, to the back contact 5 in the second longitudinal portion 4 of the second peripheral area 23.

In one embodiment of the present invention the substrate 2 is exposed in a third peripheral area 24 by removing the multilayer structure 13 and the back contact 5 to provide a surface suitable for sealing of the thin film solar cell device.

Figure 3:
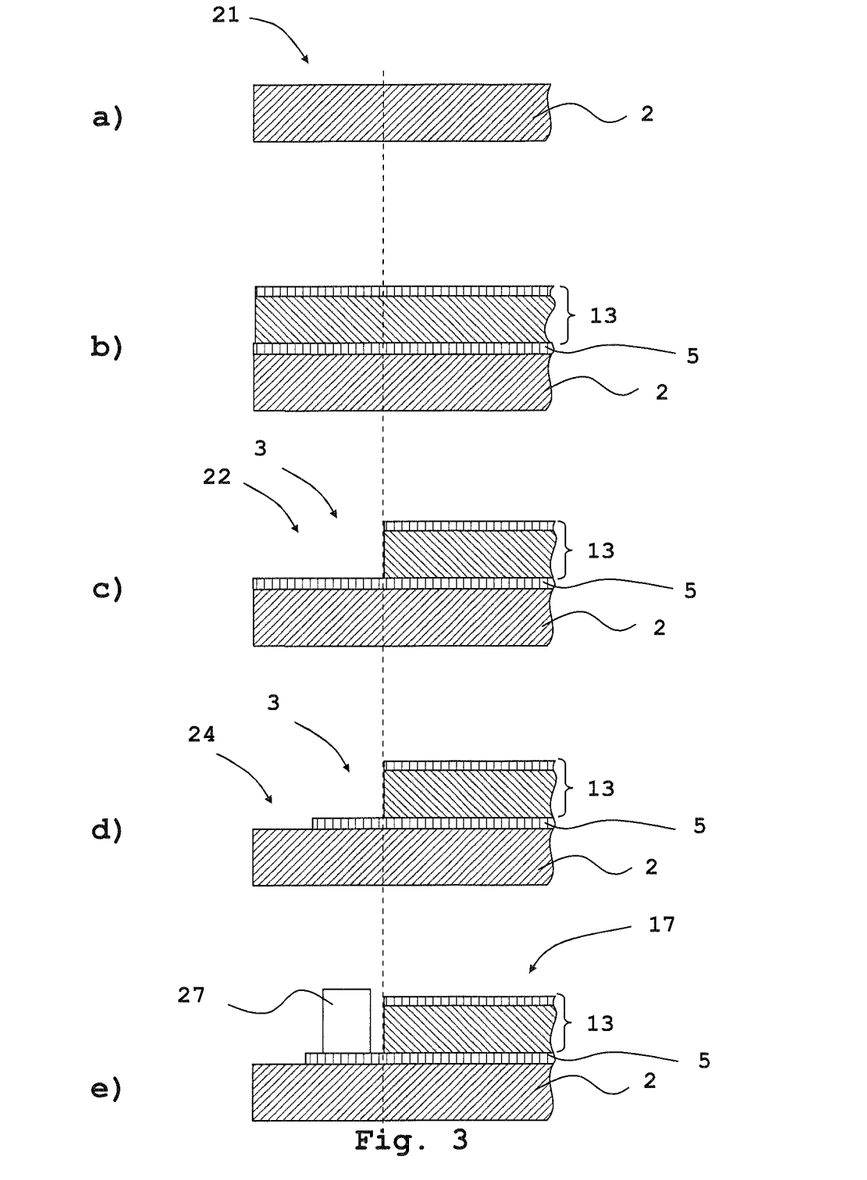

FIGS. 3a-e illustrate cross sectional views of one embodiment of the method of the present invention. In FIG. 3a a portion of a substrate 2 at a circumferential region 21 is illustrated. In FIG. 3b a layered structure comprising at least the back contact 5 and the multilayer structure 13 has been deposited. By way of example the layered structure covers essentially the whole substrate 2. Referring to FIG. 3c, an edge deletion operation is performed by selectively removing the multilayer structure 13 in at least a first peripheral area 22 in the circumferential region 21 of the thin film solar cell module 17 to expose the back contact 5 in a first longitudinal portion 3 of the first peripheral area 22. As illustrated in FIG. 3d the back contact 5 is by way of example subsequently removed in a third peripheral area 24 of the circumferential region 21 to expose the substrate 2. This provides a surface suitable for sealing of the thin film solar cell device. As illustrated in FIG. 3e the thin film solar cell module 17 is contacted by connecting a first contacting means 27 directly to the exposed back contact 5 in the first longitudinal portion 3 of the first peripheral area 22.

The removal of the back contact 2 to expose the substrate 2 in a circumferential region may be accomplished in other ways than described with reference to FIG. 3d. For example the first peripheral area 22 may not extend to an edge of the thin film solar cell module 17. Then the step of removing comprises removing both the back contact 5 and the multilayer structure 13 in a third peripheral area of the circumferential region 21.

Figure 4:
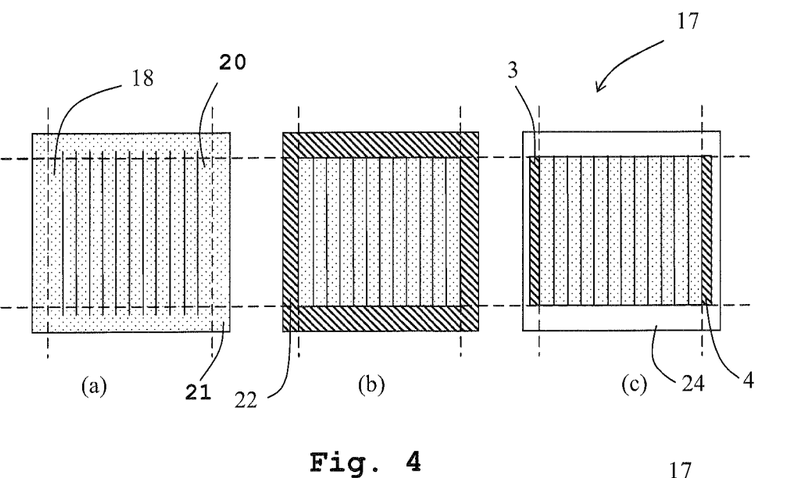
FIG. 4 and FIG. 5 are schematic illustrations of embodiments of methods for selective removal of the multilayer structure according to the invention, FIGS. 6a-b schematically illustrate alternative methods of depositing the layered structure of the thin film solar cell module in accordance with the present invention.

FIGS. 4a-c illustrate top views of one embodiment of the method of the present invention. Referring to FIG. 4a, the thin film solar cell module 17 comprises a plurality of serially-connected longitudinal thin film solar cell segments 18 beginning with a first thin film solar cell segment 18 and ending with a last thin film solar cell segment 20. The back contact 5 and a multilayer structure 13 have been deposited onto essentially the whole substrate 2 and individual thin film solar cells have been formed by patterning of the layered structure. A circumferential region 21 of the thin film solar cell module 17 is indicated by the broken lines. As mentioned above the layered structure is commonly completely removed in the circumferential region 21. However, according to the invention the layered structure is selectively removed in the circumferential region 21. Referring to FIG. 4b, the multilayer structure 13 is selectively removed in a first peripheral area 22 in the circumferential region 21 to expose the back contact 5. By way of example the first peripheral area 22 extends along a circumferential edge on all sides of the thin film solar cell module 17. As illustrated in FIG. 4c the back contact 5 is subsequently removed in a third peripheral area 24 to expose the substrate 2, leaving the back contact 5 in a first and second longitudinal portion 3, 4 of the first peripheral area 22. The first longitudinal portion 3 extends at least partly along the first thin film solar cell segment 18 and the second longitudinal portion 4 extends at least partly along the last thin film solar cell segment 20.

Figure 5:
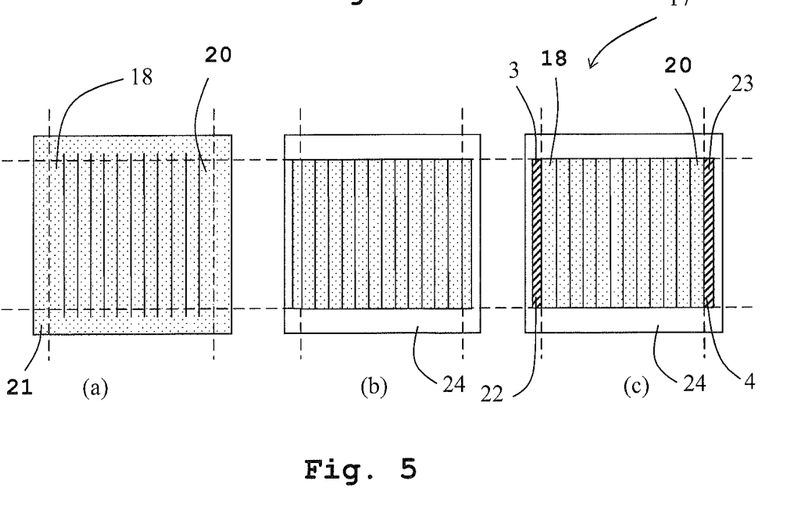

FIGS. 5a-c illustrate top views of one embodiment of the method of the present invention. Referring to FIG. 4a, the thin film solar cell module 17 comprises a plurality of serially-connected longitudinal thin film solar cell segments 18 beginning with a first thin film solar cell segment 18 and ending with a last thin film solar cell segment 20. The back contact 5 and a multilayer structure 13 have been deposited onto essentially the whole substrate 2 and individual thin film solar cells segments 18 have been formed by patterning of the layered structure. A circumferential region 21 of the thin film solar cell module 17 is indicated by the broken lines. As illustrated in FIG. 5b the multilayer structure 13 and the back contact 5 is removed in a third peripheral area 24 to expose the substrate 2. The third peripheral area 24 extends along a circumferential edge on all sides of the thin film solar cell module 17. Referring to FIG. 5c, the multilayer structure 13 is selectively removed in a first and a second peripheral area 22, 23 to expose the back contact 5 in at least a first and second longitudinal portion 3, 4 of the first and second peripheral areas 22, 23, respectively. The first longitudinal portion 3 extends at least partly along the first thin film solar cell segment 18 and the second longitudinal portion 4 extends at least partly along the last thin film solar cell segment 20.

Typically a rectangular geometry of the thin film solar cell device is preferable; however other alternatives are possible, e.g. concentrically arranged segments 18. In addition to exposing the back contact 5 in selected areas for contacting, the surface of the substrate 2 is exposed, which provides a surface suitable for sealing of the thin film solar cell device. It is possible to seal against the back contact 5, but since the sealing should prevent both leakage and short circuit it is more convenient to seal against the non-conductive substrate 2.

Figure 6A:
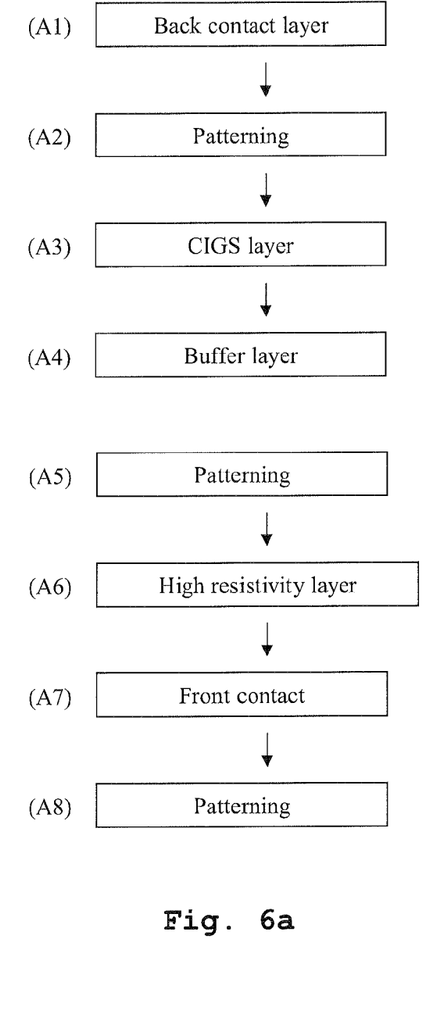

Referring to FIG. 6a, in one embodiment of the method according to the present invention the step of depositing comprises the steps of:
(A1) depositing a back contact layer 5 made of Mo;
(A2) patterning the back contact layer 5, e.g. by forming grooves in the back contact layer, to form first longitudinal segments;
(A3) depositing a GIGS layer 7 on top of the back contact layer 5;
(A4) depositing a buffer layer 9 made of CdS on top of the GIGS layer 7;
(A5) patterning of the GIGS layer 7 and the buffer layer 9 using a stylus to form second longitudinal segments parallel with, and overlapping, the first longitudinal segments in the back contact layer 5;
(A6) depositing a high resistivity layer 11 made of ZnO on top of the buffer layer;
(A7) depositing a front contact layer 13 made of a transparent conductive oxide on top of the high resistivity layer 11 to form the multilayer structure 13; and
(A8) patterning of the multilayer structure 13 using a stylus to form an array of longitudinal thin film solar cell segments 18.

Figure 6B:
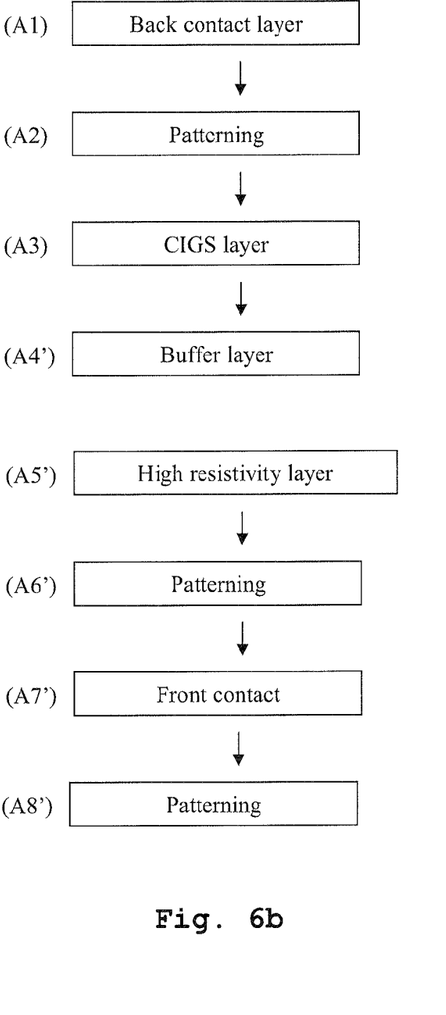

Referring to FIG. 6b, in another embodiment of the method according to the invention the step of depositing comprises the steps of:
(A1) depositing a back contact layer 5 made of Mo;
(A2) patterning the back contact layer 5 to form first longitudinal segments;
(A3) depositing a GIGS layer 7 on top of the back contact layer 5;
(A4') depositing a buffer layer 9 made of CdS on top of the GIGS layer 7;
(A5') depositing a high resistivity layer 11 made of ZnO on top of the buffer layer 9;
(A6') patterning of the CIGS layer 7, the buffer layer 9, and the high resistivity layer 11 using a stylus to form second longitudinal segments parallel with, and overlapping the first longitudinal segments in the back contact layer 5;
(A7') depositing a front contact layer 15 made of a transparent conductive oxide on top of the high resistivity layer 11 to form the multilayer structure 13; and
(A8') patterning of the multilayer structure 13 using a stylus to form an array of longitudinal thin film solar cell segments.

Figure 7:
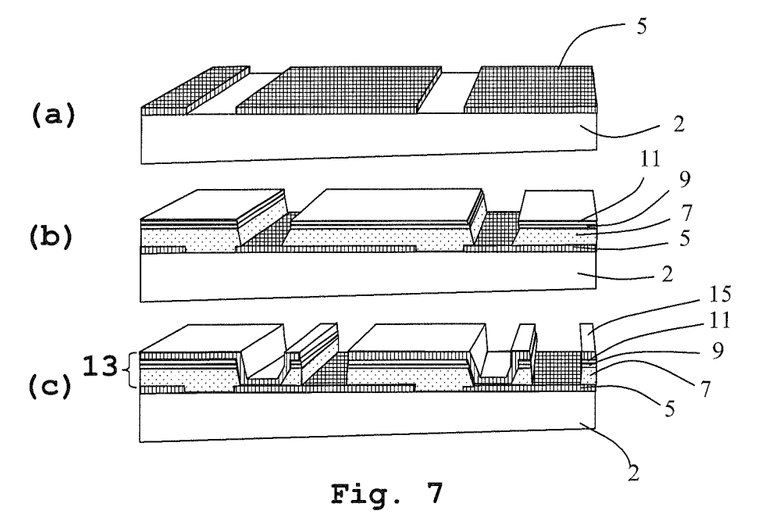
FIG. 7 is a schematic illustration of (a) deposition and patterning of the back contact, (b) deposition and patterning of the GIGS layer, the buffer layer and the high resistivity layer, and (c) deposition and patterning of the front contact in accordance with the invention.

FIG. 7a-c illustrates the principal steps of the embodiments of the method as described with reference to FIGS. 6a-b. In (a) the substrate 2 is provided with a Mo-coating, i.e. the back contact 5, which is patterned into longitudinal segments. The CIGS layer 7 is deposited by high vacuum co-evaporation. The buffer layer 9 and the high resistivity layer 11 are then deposited onto the CIGS layer. Referring to FIG. 7b, thereafter the semiconductor layers, i.e. the CIGS layer 7, the buffer layer 9 and the high resistivity layer 11, are patterned, commonly using a mechanical stylus, to form longitudinal segments parallel with, and overlapping the longitudinal segments of the Mo-coating. The front contact 15 is deposited on the top surface of the segmented semiconductor layers. As illustrated in FIG. 7c, an array of serially-connected longitudinal segments is obtained by patterning the front contact and the underlying semiconductor layers using a mechanical stylus.

In one embodiment of the method according to the invention the method further comprises the step of masking at least the multilayer structure 23 in a central portion of the thin film solar cell module 17 leaving at least the first peripheral area 22 in the circumferential region 21 unmasked. In one embodiment of the method according to the invention the step of masking comprises the step of arranging a mask made of a material that has higher erosion resistance than at least the multilayer structure 13 of the thin film solar cell module 17. Preferably a rubber material is used and the mask is pressed against the top surface of the thin film solar cell module 17. In another embodiment of the method according to the invention the step of masking comprises the step of depositing a mask layer made of a lithographically patternable material such as a photoresist, epoxy, parylene, etc. The mask is lithographically patterned to define the mask. Subsequent to the selective removal of the multilayer structure 13 the mask is removed e.g. by dissolving the mask in a solvent and rinsing.

Figure 8:
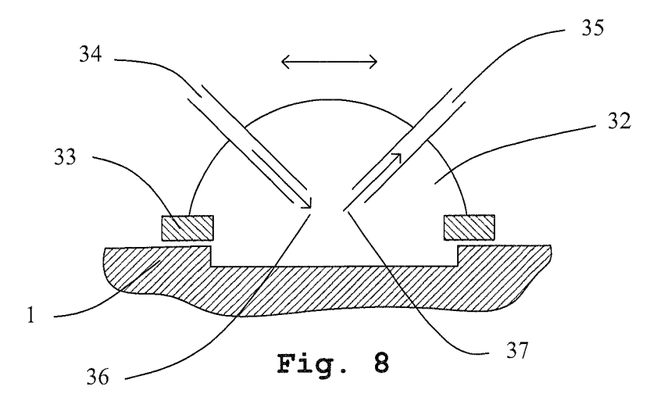
FIG. 8 is a schematic cross sectional view of a blasting chamber used to selectively remove the layered structure of a thin film solar cell module according to the invention.

In one embodiment of the method according to the invention the step of selectively removing using blasting is performed maskless, i.e. without a mask. FIG. 8 schematically illustrates a movable blast chamber 32 comprising a planar frame 33 that defines the region to be blasted, means for supplying blasting agents 36 to the surface to be blasted, i.e. a thin film solar cell module 17 comprising at least a first thin film solar cell segment 18, and means for gathering debris 37 resulting from a blasting operation. The blast chamber 32 is arranged with the planar frame 33 essentially parallel with the top surface of the thin film solar cell module 17 without getting in contact with multilayer structure 13. In FIG. 8 the blasted region is shown by a stepped down region of the layered structure of a thin film solar cell segment 18. In the blasting operation blasting agents 36 are supplied to the surface of the thin film solar cell module 17. The blasting agents 36 impinge on a sample to be blasted, i.e. the multilayer structure 13, and remove debris 37 of the sample. By simultaneously gathering the debris 37 and the blasting agents 36 that have already impinged on the surface the sample is kept free from residuals of the blasting operation. A blasting equipment of this kind is disclosed in U.S. Pat. No. 6,977,780. The multilayer structure 13 can be removed with high precision if high precision means for moving the blasting chamber 32 and/or the thin film solar cell module 17 is used.

The material removal using blasting may either be selective or the substrate 2 is exposed, depending on the relative speed between the blasting chamber 32 and the thin film solar cell module 17.

The selective removal using the maskless approach of the present invention provides an efficient and reliable method to perform edge deletion of thin film solar cell modules. Masking steps are not needed and the surface of the thin film solar cells, and the blasted sample as well as the environment, are essentially cleaner than using conventional blasting methods.

Figure 9:
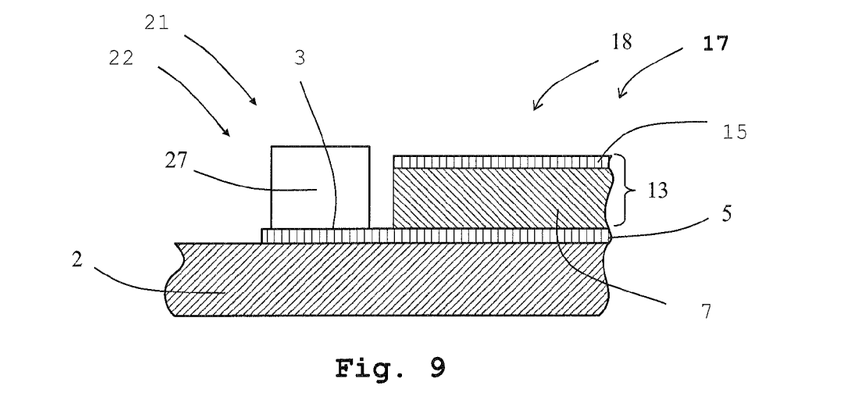
FIG. 9 is a schematic cross sectional view of one embodiment of a method for contacting of a thin film solar cell module according to the present invention using a conductive strip, FIGS. 10a-d schematically illustrate alternative methods of contacting a thin film solar cell module according to the invention.

Referring to FIG. 9, in one embodiment of the method according to the invention the step of connecting comprises connecting a contacting means 27 in the form of e.g. a conductive strip or a wire to the exposed back contact 5 using welding, soldering, electric spot welding, thermocompression bonding, ultrasonic welding, gluing or the like. These techniques can be used owing to different properties of the back contact 5 compared with the front contact 15 that usually is used for contacting. FIG. 9 illustrates an arrangement with a conductive strip 27 attached to the exposed back contact 5 Preferably a first contacting means 27 is connected to the exposed back contact 5 adjacent to a longitudinal edge of the thin film solar cell module 17, which is divided into serially-connected longitudinal thin film solar cell segments 18, and a second contacting means 29 is connected to the exposed back contact 5 adjacent to the opposing longitudinal edge of the multilayer thin film solar cell module 17.

Figures 10A, 10B:
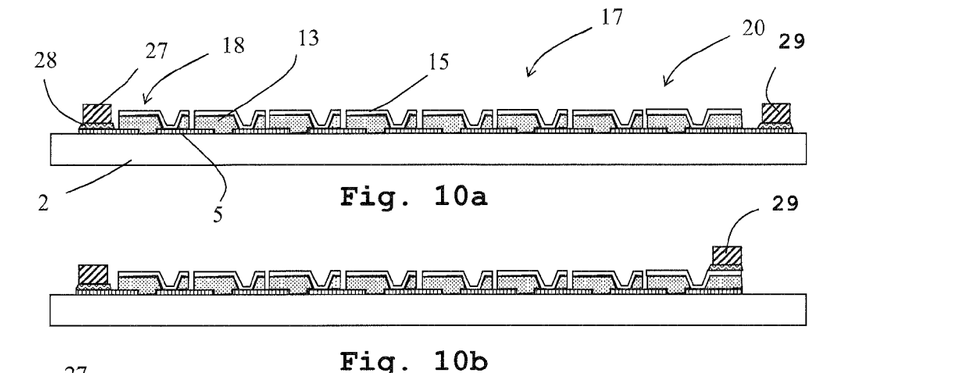

Referring to FIG. 10a, in one embodiment of a method according to the invention the step of connecting comprises attaching a first contacting means 27, e.g. by attaching a conductive strip using a conductive glue 28, to the exposed back contact 5 adjacent to the first longitudinal thin film solar cell segment 18 and attaching a second contacting means 29 to the exposed back contact 5 adjacent to the last longitudinal thin film solar cell segment 20.

Referring to FIG. 10b, in another embodiment of a method according to the invention the step of connecting comprises attaching a second contacting means 29 with e.g. conductive glue 28 to the front contact 15 of a longitudinal thin film solar cell segment. As illustrated in FIG. 10b, a first contacting means 27 is connected to the exposed back contact 5 adjacent to the first longitudinal thin film solar cell segment 18 and the second contacting means 29 is attached to the last thin film solar cell segment 20.

Figure 10C:
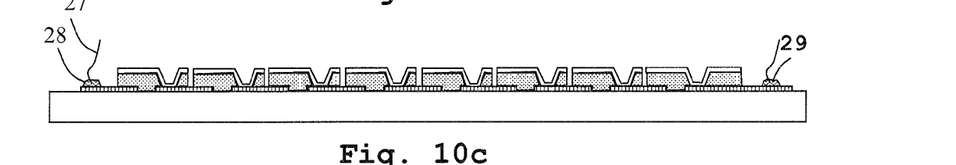
Figure 10D:
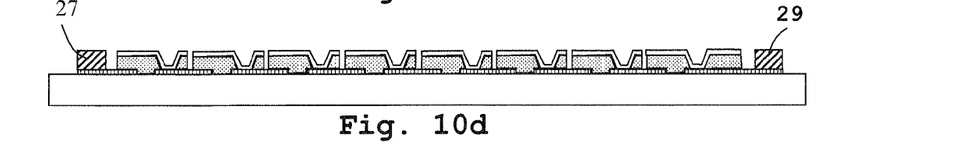

The step of connecting a contacting means 27, 29 to contact the tin film solar cell module may be accomplished in many ways and FIG. 10c and FIG. 10d illustrates further examples. FIG. 10c illustrates a thin film solar cell module 17 contacted by attaching a conductor wire 27, 29 to a conductive joint 28 applied to each exposed back contact 5 adjacent the longitudinal thin film solar cell segments 18, 20 at opposite ends of the module 17. The conductive joint may be e.g. conductive glue or similar that is provided on the back contact. FIG. 12d illustrates a thin film solar cell segment array contacted by attaching a conductive strip to each exposed back contact in the opposite ends of the array without using conductive glue, i.e. methods such as thermocompression bonding is used.

The term "directly", which is used in connection with the connection of contacting means 27, 29 above, should be interpreted as there are no intermediate layers between the contacting means 27, 29 and the back contact except for any layers used for attaching the contacting means 27, 29 such as the conductive glue mentioned above, i.e. there is no multilayer structure 13 left on the back contact 5.

One example of a method of manufacturing, contacting and packaging a thin film solar cell device according to the present invention comprises the following steps:

(a) Depositing a back contact 5 of molybdenum on a rectangular glass substrate 2.

(b) Patterning the back contact 5 to define longitudinal thin film solar cell segments extending in parallel with an edge of the substrate 2.

(c) Depositing a CIGS layer 7 on the back contact 5 using high vacuum co-evaporation of the elements Cu, In, Ga and Se in an in-line production apparatus.

(d) Depositing a buffer layer 9 of CdS on the CIGS layer 7.

(e) Patterning the CIGS layer 7 and the buffer layer 9 using a mechanical stylus or laser ablation to form second longitudinal segments parallel with, and overlapping, the first longitudinal segments of the back contact 5.

(f) Depositing a high resistivity layer 11 of ZnO on the patterned buffer layer 9.

(g) Depositing a front contact 15 of a transparent conductive oxide on the high resistivity layer 11 to form the multilayer structure 13 which is intended to function as a thin film solar cell.

(h) Patterning the multilayer structure 13 using a mechanical stylus or laser ablation to form an array of longitudinal thin film solar cell segments 18.

(i) Selectively removing the multilayer structure 13 in a first peripheral area 22 by maskless blasting, thereby exposing the back contact 5 in at least a first longitudinal portion 3 of the first peripheral area 22.

(j) Removing the multilayer structure 13 and the back contact 5 in a third area 24 by maskless blasting, thereby exposing the substrate 2 in the third area 24.

(k) Connecting at least a first contacting means 27 to the longitudinal portion 3 using e.g. thermocompression bonding.

(l) Laminating a polymer film between the multilayer structure 13 and a front glass by applying heat and pressure. The film prevents current leakage and short circuits, and makes the thin film solar cell device more robust.

(m) Arranging a junction box onto the substrate 13.

(n) Connecting the first contacting means 27 to the junction box through the edge of the thin film solar cell module 17 or holes extending through the substrate or the front glass.

Figure 11:
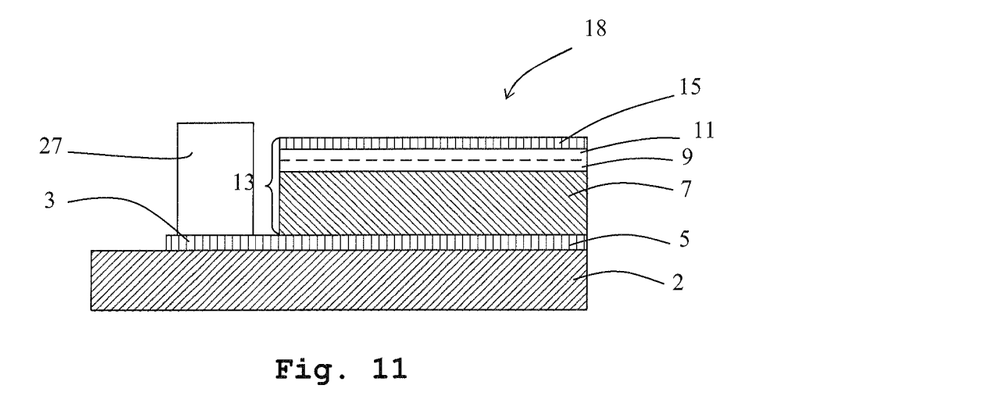
FIG. 11 is a schematic illustration of a first contacting means contacted directly to the back contact of a thin film solar cell module according to the invention.

FIG. 11 schematically illustrates cross sectional view of a thin film solar cell module 17 according to the present invention. The thin film solar cell module 17 comprises a substrate 2 coated with a back contact layer 5 and a multilayer structure 13 forming at least a first thin film solar cell segment 18, wherein the multilayer structure 13 comprises at least a CIGS layer 7 and a front contact layer 15 and optionally a buffer layer 9 and/or a high resistivity layer 11. The back contact 5 extends outside the multilayer structure 13 in a first longitudinal portion 3 of a first peripheral area 22 of the thin film solar cell module 17. Further the thin film solar cell module 17 comprises at least a first contacting means 27 connected to the back contact layer 5, which can be used to establish a first electrical connection to the thin film solar cell module 17.

Figure 12:
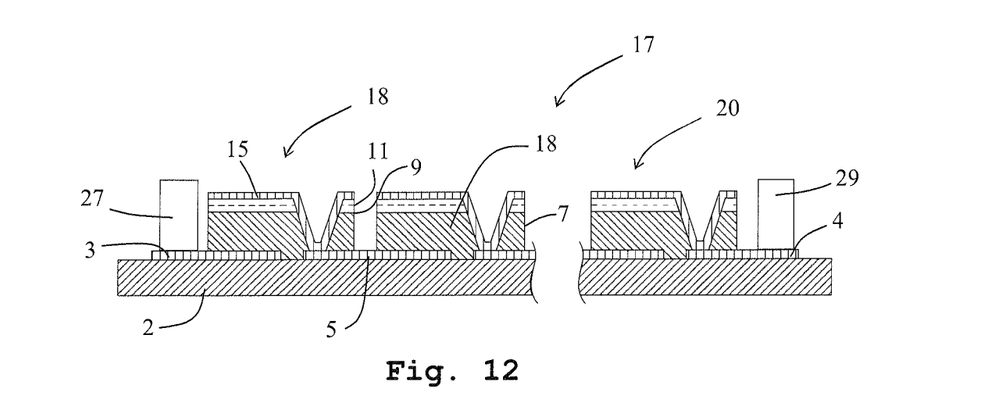
FIG. 12 is a schematic illustration of a first contacting means contacted directly to the back contact in both ends of a thin film solar cell module according to the invention.

FIG. 12 schematically illustrates one embodiment of the present invention wherein the layered structure of the thin film solar cell device is patterned to form serially-connected longitudinal thin film solar cell segments 18. At least a first portion 3 of the back contact layer 5 extends outside the multilayer structure 13 along a longitudinal segment 19 in one end of the device. A second portion 4 of the back contact layer 5 is extending outside the multilayer structure 13 along a longitudinal thin film solar cell segment 20 at the other end of the device. The first contacting means 27 and the second contacting means 29 are connected to the first portion 3 and the second portion 4 of the back contact layer 5, respectively. The first 27 and the second contacting means 29 establish a first and a second connection to the thin film solar cell device, which can be used to extract the power from the thin film solar cell device.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. A method for manufacturing a thin film solar cell device comprising the steps of:
    providing a substrate (2) with a back contact (5), wherein the back contact (5) is patterned into a plurality of longitudinal segments;
    providing a multilayer structure (13) with at least a CIGS layer (7) and a front contact (15) on the substrate (2), wherein the multilayer structure (13) is patterned into a plurality of longitudinal segments, each of them overlapping a respective longitudinal segment of the back contact (5) and together forming longitudinal thin film solar cell segments (18) that are serially connected in order to form a thin film solar cell module (17); characterized in that the method further comprises the subsequent steps of
    selectively removing the multilayer structure (13) in at least a first peripheral area (22) of the thin film solar cell module (17) to expose the back contact (5) in at least a first longitudinal portion (3) of the first peripheral area (22) adjacent a first longitudinal thin film solar cell segment (18) by blasting; and
    connecting a first contacting means (27) to the exposed back contact (5).

2. The method according to claim 1, wherein the blasting is performed without the use of a mask.

3. The method according to claim 1, wherein the step of blasting comprises arranging a blasting chamber (32) at a predefined position adjacent to the top surface of a thin film solar cell module (17) and moving the thin film solar cell module (17) and the blasting chamber (32) relative to each other as blasting agents (36) are supplied and debris (37) are gathered within the blasting chamber (32).

4. The method according to claim 3, wherein the step of blasting comprises the step of providing the blasting agent (36) to the blasting chamber (36) in a sequence of predetermined doses.

5. The method according to claim 1, wherein the step of edge deletion by selectively removing the multilayer structure (13) further comprises the step of exposing the back contact in a second longitudinal portion (4) of a second peripheral area (22) of the thin film solar cell module (17) adjacent to a last longitudinal thin film solar segment (20), the first and the second longitudinal portions (3, 4) being at opposite sides of the thin film solar cell module (17).

6. A method according to claim 5, further comprising connecting a second contacting means (29) to the back contact (5) in the second longitudinal portion (4) of the second peripheral area (23).

7. The method according to claim 1, further comprising the step of removing the multilayer structure (13) and the back contact (5) in at least a third peripheral area (24) to expose the substrate (2).

8. The method according to claim 6, wherein the step of connecting the contacting means (27, 29) to the back contact (5) comprises ultrasonic welding.

9. The method according to claim 1, wherein the step of connecting the contacting means (27, 29) to the back contact (5) comprises thermocompression bonding.

10. The method according to claim 1, wherein the step of connecting the contacting means (27, 29) to the back contact (5) comprises electric spot welding.

11. The method according to claim 3, wherein the selective removal using blasting is controlled by varying the speed of the relative motion between the thin film solar cell module (17) and the blasting chamber (32).

12. The method according to claim 2, wherein the step of blasting comprises arranging a blasting chamber (32) at a predefined position adjacent to the top surface of a thin film solar cell module (17) and moving the thin film solar cell module (17) and the blasting chamber (32) relative to each other as blasting agents (36) are supplied and debris (37) are gathered within the blasting chamber (32).

13. The method according to claim 4, wherein the selective removal using blasting is controlled by varying the speed of the relative motion between the thin film solar cell module (17) and the blasting chamber (32).

* * * * *